(12) United States Patent
Chuang et al.

(10) Patent No.: US 6,765,520 B1
(45) Date of Patent: Jul. 20, 2004

(54) METHOD AND CIRCUIT FOR JAMMING DIGITAL FILTER WHILE RESETTING DELTA SIGMA MODULATOR

(75) Inventors: Shang-Yuan Chuang, Tucson, AZ (US); James L. Todsen, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/419,429

(22) Filed: Apr. 21, 2003

(51) Int. Cl.$^7$ ................................................. H03M 3/00
(52) U.S. Cl. ....................................... 341/143; 341/144
(58) Field of Search ................................ 341/143, 144, 341/155, 200, 118, 120, 145, 150

(56) References Cited

U.S. PATENT DOCUMENTS

| | | | |
|---|---|---|---|
| 5,012,244 A | 4/1991 | Wellard et al. | ............. 341/143 |
| 5,977,895 A | 11/1999 | Murota et al. | ............. 341/143 |
| 6,064,326 A | 5/2000 | Krone et al. | ............. 341/143 |
| 6,362,763 B1 | 3/2002 | Wang | ............. 341/143 |
| 6,489,907 B2 * | 12/2002 | Cusinato et al. | ............. 341/143 |
| 6,522,277 B2 * | 2/2003 | Fujimori et al. | ............. 341/144 |

* cited by examiner

*Primary Examiner*—Brian Young
*Assistant Examiner*—Joseph Lauture
(74) *Attorney, Agent, or Firm*—W. Daniel Swayze, Jr.; W. James Brady; Frederick J. Telecky, Jr.

(57) ABSTRACT

An analog-to-digital converter (10) includes a high order delta sigma modulator followed by a decimation filter. A monitor circuit (104)coupled to the output of the delta sigma modulator operates to reset its integrators if an unstable condition is detected on the output. The monitor circuit produces first and second jamming signals in response to either a detected overvoltage or undervoltage of the delta sigma modulator input. A logic circuit (SW1) includes a data input coupled to the output of the delta sigma modulator and a data output (89) that jams the input of digital filter (106) with "1"s or "0"s in response to the first or second jamming signal, respectively, to ensure a correct (+) or (−) full scale decimation filter output.

16 Claims, 9 Drawing Sheets

DURING Φ1 OF NORMAL OPERATION:

DURING Φ2 OF NORMAL OPERATION:

DURING Φ1 OF RESET OPERATION:

DURING Φ2 OF RESET OPERATION:

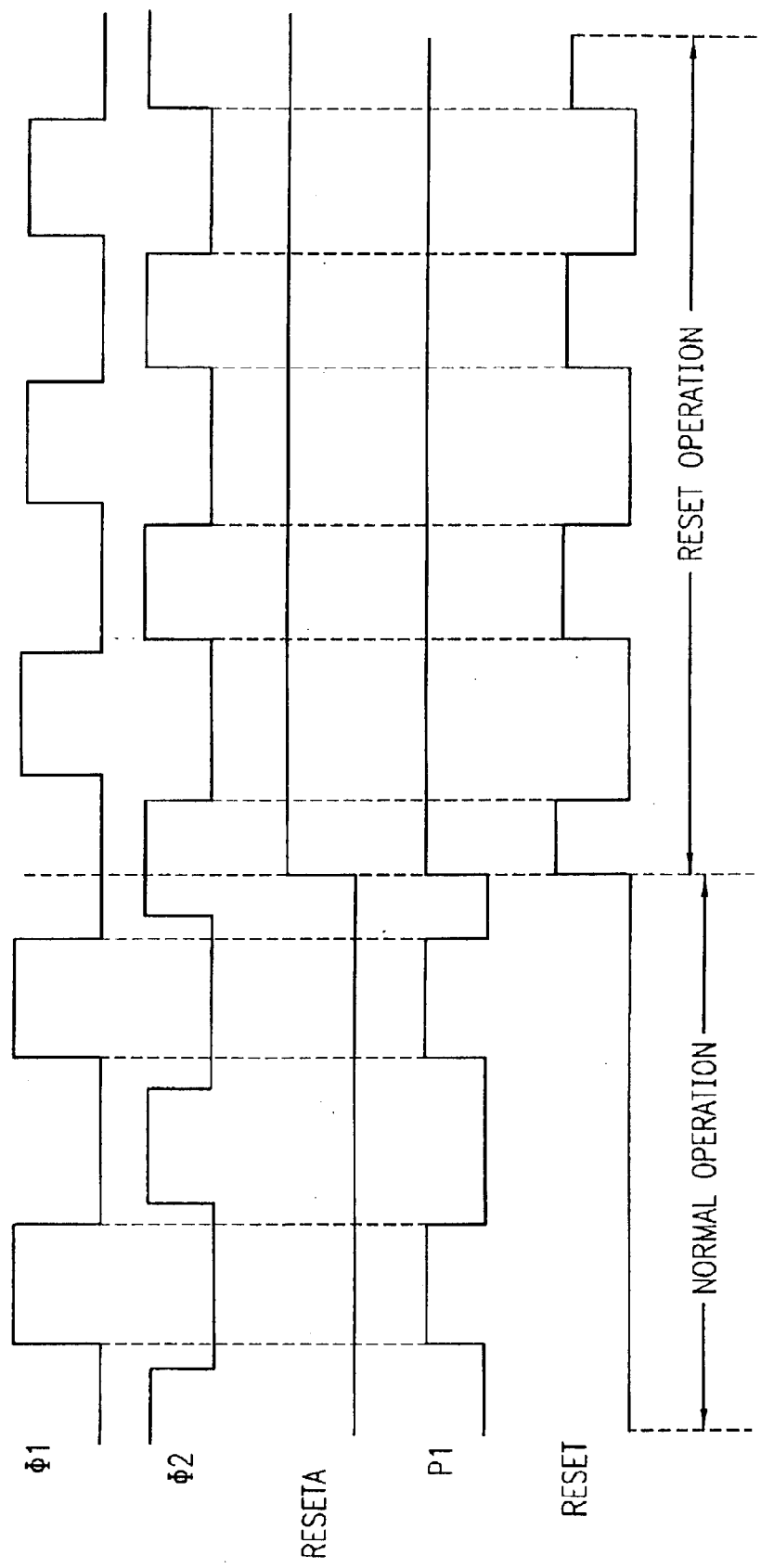

METHOD AND CIRCUIT FOR JAMMING DIGITAL FILTER WHILE RESETTING DELTA SIGMA MODULATOR

BACKGROUND OF THE INVENTION

The present invention relates generally to improvements in delta-sigma modulator analog-to-digital converters, and particularly, to improvements in delta-sigma analog-to-digital converters which are useful not only for measuring AC input voltages but are especially suitable for measuring DC voltages.

Various techniques of providing analog-to-digital conversion of signals are well known. One well-known oversampling analog-to-digital (A/D) conversion technique uses a delta-sigma modulator including one or more integrators, a comparator, and a digital-to-analog converter (DAC) in the feedback path. A low-pass decimation filter is used allowing the modulator to provide necessary filtering. Typically, it is desirable in the design of a delta-sigma modulator to reduce quantization noise, which may be achieved by providing a transfer function for the overall modulator that possesses high in-band gain and high out-of-band attenuation, thereby shaping the quantization noise spectrum advantageously. This is usually accomplished by use of higher order delta signal modulators, which include multiple integration stages. Higher order modulators become unstable and therefore oscillate for inputs that exceed certain bounds. Instability may also occur as a result of the modulator being powered up since, since powering up of operational amplifier integrators with arbitrary initial states may place the modulator in an unstable region of its state space. Therefore, higher order delta sigma modulators require circuitry for detecting instability and restoring or resetting the modulator loop back to a stable state.

One approach to correcting the instability found in higher order modulators (three or more integration stages) is to use state-variable clamping techniques. FIG. 2 shows an integration stage 18 of a modulator including an operational amplifier 20 having an integration capacitor 22 and a limiter 24 coupled between the non-inverting input and the output of the operational amplifier 20. A non-linear element, such as a limiter, coupled across the integrating capacitor 22 prevents large values from appearing at the integrator output. Typically, for a higher order modulator circuit, the non-linear elements are set to turn "ON" at voltage levels of about 20–50% higher than the peak-to-peak integrator voltage swings. Examples of limiting schemes implemented in an integrator stage are shown in U.S. Pat. No. 5,977,895 by Murota et al., issued Nov. 2, 1999, entitled "WAVEFORM SHAPING CIRCUIT FOR FUNCTION CIRCUIT AND HIGH ORDER DELTA SIGMA MODULATOR", Pat. No. 6,064,326 by Krone et al., issued May 16, 2000, entitled "ANALOG-TO-DIGITAL CONVERSION OVERLOAD DETECTION AND SUPPRESSION", and U.S. Pat. No. 5,012,244 by Wellard et al., issued Apr. 30, 1991, entitled "DELTA-SIGMA MODULATOR WITH OSCILLATION DETECT AND RESET CIRCUIT" disclose known ways of detecting instability of a delta sigma modulator and restoring it to a stable state.

However, the closest prior art to the present invention is believed to be commonly assigned U.S. Pat. No. 6,362,763 by Wang, entitled METHOD AND APPARATUS FOR OSCILLATION RECOVERY IN A DELTA-SIGMA A/D CONVERTER, issued Mar. 26, 2002. FIGS. 1 and 2 labeled "prior art" herein, herein indicate the circuit structure of the integrators included in the delta sigma modulator of the '763 patent. The delta sigma ADC disclosed in this patent is primarily useful for processing audio input signals. However, it is not well suited for converting DC input signals to digital values because if the modulator becomes unstable as a result of a positive over-range input signal, the positive full scale digital output of a digital filter (that receives and filters the output of the delta sigma modulator) is reset to a negative full scale digital value when the circuit that detects the instability resets the modulator to a stable state. This is unacceptable because in many applications in which an ADC is used to measure and convert a DC input voltage to a digital output, it is highly desirable that a positive full scale output (i.e., all "1"s), not a negative full scale output (i.e., not all "0"s), be produced at the digital filter output. This is not the case in typical audio applications, because in audio applications it usually is acceptable for the digital filter output to be reset to all "0"s whenever the modulator and the digital filter are reset as a result of the positive range of the modulator input being exceeded.

Another problem with the delta sigma modulator shown in U.S. Pat. No. 6,362,763 is that its circuit topology results in possible unbalanced parasitic capacitances which produce errors due to the additional switch 70 that is coupled between the input nodes of the differential amplifier 64. These parasitic-capacitance-errors are amplified by amplifier 64 and can substantially reduce the accuracy of the delta sigma modulator. Also, in some implementations, the switch 70 must be located a long distance on the semiconductor chip from the switch 72, which may necessitate use of different reset signals to control the two switches to ensure that they are simultaneously turned on and off to avoid errors at the sensitive (+) and (−) inputs of the amplifier 64.

Thus, there is an unmet need for an improved inexpensive delta sigma ADC of order greater than 1 that is especially suited to measuring/converting DC input voltages to digital values.

There also is an unmet need for an improved inexpensive delta sigma ADC of order greater than 1 which does not reset a digital filter thereof to "0"s (i.e., to a negative fall scale value) whenever a positive input signal causes the delta sigma modulator to become unstable.

There also is an unmet need for a more accurate delta sigma modulator in a delta sigma ADC of order greater than 1 which does not reset a digital filter thereof to "0"s every time a positive input signal causes the delta sigma modulator to become unstable.

There also is an unmet need to avoid inaccuracy caused by unbalanced parasitic devices in the integrators of a delta sigma ADC of order greater than 1 which does not reset a digital filter thereof to "0"s whenever a positive input signal causes the delta sigma modulator to become unstable, wherein unbalanced parasitics are avoided in the integrating stages.

SUMMARY OF THE INVENTION

It is an object of the present invention to provide an improved inexpensive delta sigma ADC of order greater than 1 that is especially suited to measuring/converting DC input voltages to digital values.

It is another object of the present invention to provide an improved, inexpensive delta sigma ADC of order greater than 1 which does not reset a digital filter thereof to "0"s whenever a positive input signal causes the delta sigma modulator to become unstable.

It is another object of the present invention to provide a more accurate delta sigma modulator in a delta sigma ADC of order greater than 1 which does not reset a digital filter thereof to "0"s whenever a positive input signal causes the delta sigma modulator to become unstable.

It is another object of the present invention to provide a more accurate delta sigma modulator in a delta sigma ADC of order greater than 1 which produces a steady, reliable (+) full scale output whenever there is a (+) out-of-range analog input sufficient to cause the delta sigma modulator to become unstable.

It is another object of the present invention to provide an improved delta sigma ADC of order greater than 1 which does not reset a digital filter thereof to "0"s whenever a positive input signal causes the delta sigma modulator to become unstable, wherein unbalanced parasitics are avoided in the integrating stages.

Briefly described, and in accordance with one embodiment, the present invention provides an analog-to-digital converter including a delta sigma modulator which includes an input conductor (86), and a summing device (102) having a first input coupled to the input conductor, a quantizer (98) for producing a modulator output signal on an output conductor (88) of the quantizer, a plurality of integrators (92, 94, 96) coupled sequentially between an output of the summing element and an input of the quantizer, and a digital-to-analog converter (100) having an output coupled to a second input of the summing device (102) for providing feedback to the second input representative of signal conditions in one or more of the integrators. A monitor circuit (104) includes an input responsive to one of a signal appearing at the input of the quantizer and a signal appearing at the output of the quantizer to produce a control signal (JAM1) in response to occurrence of an instability condition caused by a positive input overvoltage on the input conductor and represented by the one of the signals at the quantizer input and output, respectively. A digital filter (106) includes an input coupled to the output conductor (88) of the quantizer and an output. A logic circuit operates so as to, in effect, perform a logical ORing function on the digitally filtered output of the quantizer and the control signal (JAM1) so as to produce either a digital (+) full scale output indicative of a (+) out-of-range analog input signal or a digital analog-to-digital-converted output signal produced by the digital filter.

In one described embodiment, an analog-to-digital converter (10) including a delta sigma modulator which includes an input conductor (86), a first summing device (102) having a first input coupled to the input conductor, a second summing device (96) having a plurality of inputs and also having an output coupled to an input of a quantizer (98) having an output coupled to an output (88) of the delta sigma modulator, a plurality of integrators (92-1,2 . . . n) coupled sequentially between an output of the first summing element and the second summing device (96), an output of each integrator being fed forward to an input of the second summing device, respectively, each integrator having a restore input, and a digital-to-analog converter (100) having an input coupled to the output (88) of the delta sigma modulator and an output coupled to a second input of the first summing device (102). A monitor circuit (104) includes an input coupled to the output of the delta sigma modulator, and a reset output (77) coupled to the restore input of one or more of the integrators to restore the delta sigma modulator from an unstable condition to a stable condition. The monitor circuit also includes a first jamming output for producing a first jamming signal in response to occurrence of a first signal condition on the output (88) of the delta sigma modulator and a second jamming output for producing a second jamming signal in response to occurrence of a second signal condition on the output of the delta sigma modulator. A switch circuit (SW1) includes a data input coupled to the output (88) of the delta sigma modulator, a data output (89), and first and second control inputs coupled to the first and second jamming outputs of the monitor circuit, respectively. A digital filter (106) includes an input coupled to the output of the switch circuit (SW1) and an output coupled to an output was (98) of the analog-to-digital converter (10).

In the described embodiment, the switch circuit (SW1) is configured to produce a first sequence of logical "1"s in response to the first jamming output and to produce a second sequence of logical "0"s in response to the second jamming output.

BRIEF DESCRIPTION OF THE DRAWINGS

FIG. 7 is a timing diagram that shows the various signals used in FIG. 3.

DETAILED DESCRIPTION OF THE PREFERRED EMBODIMENTS

Figure 3:
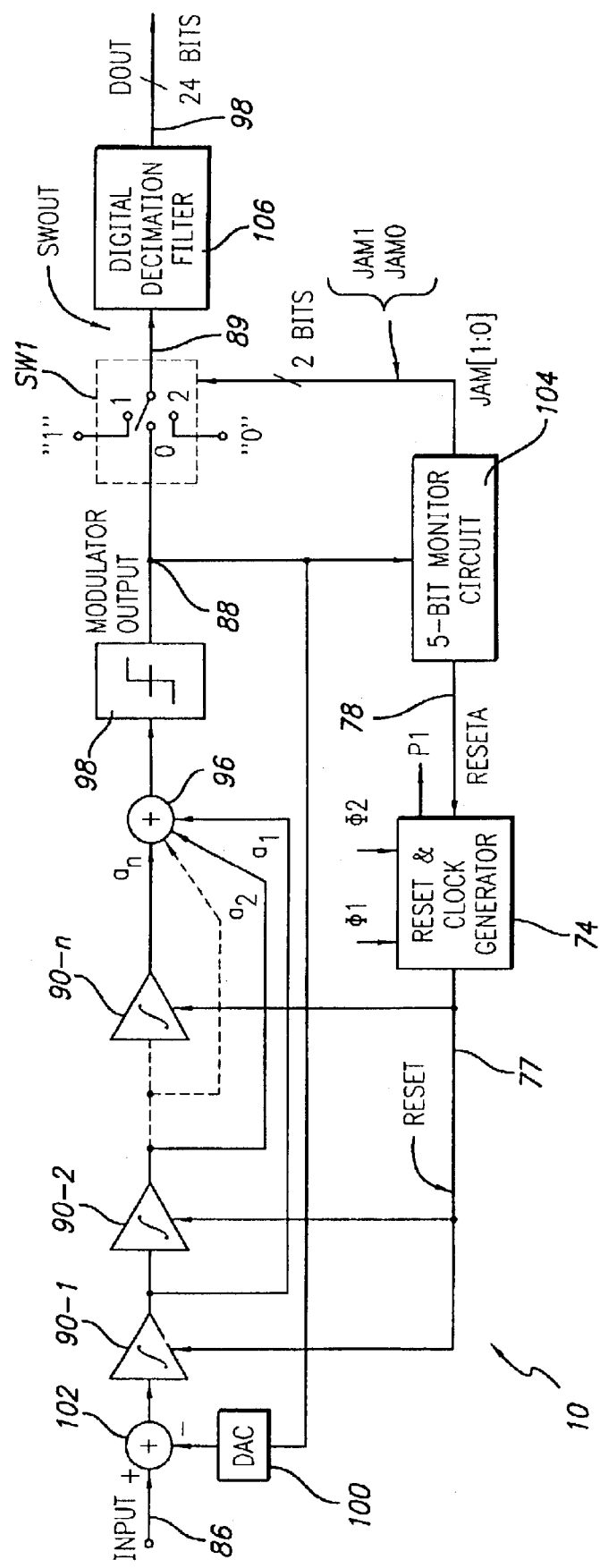
FIG. 3 is a block diagram of a delta sigma ADC of present invention.

Referring to FIG. 3, a delta-sigma ADC 10 includes a high order delta sigma modulator which includes an input conductor 86 conducting an analog input signal INPUT to the (+) input of an analog summer 102, a plurality of n successively coupled or cascaded integrator stages including integrator stages 90-1,2 . . . n, a quantizer 98, n feedforward conductors a1, a2, . . . $a_n$, and an output conductor 88 conducting the modulator output signal MODULATOR OUTPUT. The output of the first integrator 90-1 is coupled to the input of integrator 90-2, the output of which is coupled to the input of the next integrator, and so forth. The feedforward conductors $a_1$, $a_2$ and an are coupled to the outputs of each integrator stage 90-1,2 . . . n, respectively. The feedforward conductors $a_1$, $a_2$ and $a_n$ couple outputs of the respective integrator stages forward to corresponding inputs of an analog summer 96, the output of which is coupled to the input of a first summer or summing junction 96, the output of which is coupled to the input of a quantizer 98. (Quantizer 98 can be any device that generates a digital output in response to an analog input, such as, but not limited to, a comparator, a 1bit A/D converter, or the like.)

The digital output of quantizer 98 is coupled to modulator output conductor 88. The modulator output conductor 88 is coupled to an input of a switch circuit SW1 and also to an input of a 5-bit monitor circuit 104. In the embodiment shown, monitor circuit 104 "monitors" a signal MODULATOR OUTPUT on conductor 88 to detect the occurrence of any sequence of 24 consecutive "1"s and any sequence of 24 consecutive "0"s thereon. One output of 5-bit monitor circuit 104 is coupled by a conductor 78 to an input of a reset and clock signal generator circuit 74 which generates an output signal RESET on conductor 77. Conductor 77 is connected to a reset input of each of the integrator stages 90-1,2 . . . n to reset them if an unstable or potentially unstable condition (which in this case is represented by a sequence of 24 consecutive "1"s or 24 consecutive "0"s of MODULATOR OUTPUT), is detected. Thus, 5-bit monitor circuit 104, which can be implemented as a state machine (subsequently described with reference to FIG. 9), functions as a detect and restore circuit that operates to monitor the characteristics of the modulator output signal to determine if the delta sigma modulator is operating at or near what is considered to be an unstable condition. Whenever it is determined that the delta sigma modulator is at or near an unstable condition, monitor circuit 104 generates a signal RESETA on conductor 78, which causes reset and clock generator circuit 74 to apply a restore signal RESET to the restore inputs of at least some of integrators 90-1,2 . . . n to selectively restore them to a stable condition.

Modulator output conductor 88 also is fed back to the digital input of a DAC 100, the output of which is coupled to the (−) input of analog summer 102. The output of analog summer 102 is coupled to the input of the first integrator stage 90-1. Decimation filter 106 is a conventional digital filter that can be easily implemented by those skilled in the art.

In accordance with the present invention, delta sigma ADC 10 includes above-mentioned switch circuit SW1, which in FIG. 3 is simplistically represented as a 3-position switch that receives the modulator output signal MODULATOR OUTPUT on conductor 88, and also receives two "jamming" or control signals JAM1 and JAM0 via a 2-conductor bus coupled to another output of monitor circuit 104. Switch circuit SW1 is a logic circuit that produces a serial-format switch output signal SWOUT on conductor 89 and provides it as an input to a digital decimation filter 106. The filtered output of digital decimation filter 106 is produced as a parallel-format 24-bit signal DOUT on a 24-bit bus 98 to accurately represent the analog input signal INPUT. Decimation filter 106 is a conventional digital filter that can be easily implemented by those skilled in the art.

Figure 4:
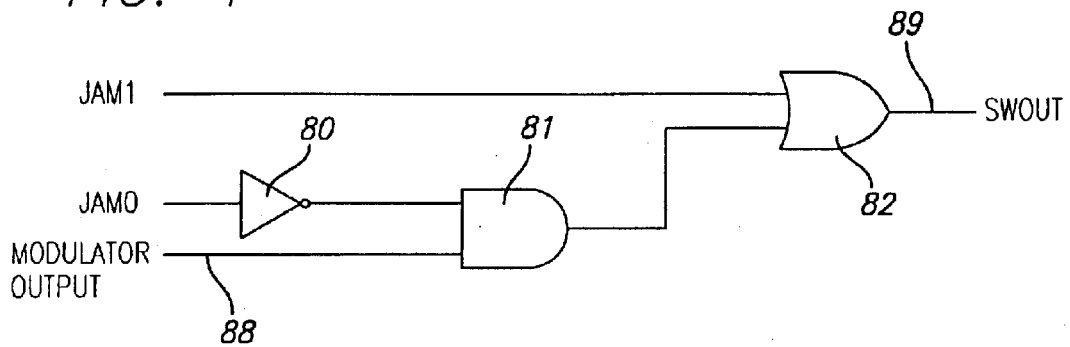
FIG. 4 is a logic diagram of the switch SW1 in FIG. 3.

Referring to FIG. 4, switch circuit SW1 can be implemented as a logic circuit that includes an inverter 80, an AND gate 81, and an OR gate 82. One input of OR gate 82 receives the control signal JAM1 from monitor circuit 104. The other input of OR gate 82 is coupled to the output of AND gate 81. The output of OR gate 82 is connected to produce the switch output signal SWOUT on conductor 89. One input of AND gate 81 is connected to the output of inverter 80, the input of which receives the control signal JAM0 from 5-bit monitor circuit 104. The other input of AND gate 81 receives the signal MODULATOR OUTPUT on conductor 88 from quantizer 98. (The function provided by the particular logic circuit shown in FIG. 4 can, however, be implemented in various other ways.)

Figure 6:
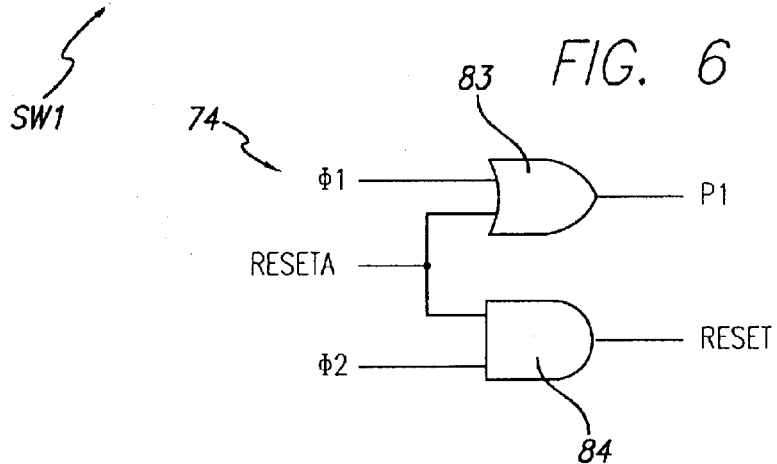
FIG. 6 is a logic diagram for a circuit generating the signals P1 and RESET used in FIG. 3.

Referring next to FIG. 6, reset and clock generator circuit 74 includes OR gate 83 and AND gate 84. Clock signal $\phi 1$ is coupled to one input of OR gate 83, the output of which produces P1. RESETA is coupled to the other input of OR gate 83 and AND gate 84. Clock signal $\phi 2$ is coupled to the other input of AND gate 84, the output of which produces RESET. Reset and clock generator circuit 74 can be utilized to produce the subsequently described switch control signal P1 and the subsequently described signal RESET in response to the two clock signals $\phi 1$ and $\phi 2$ and the output RESETA produced by 5-bit monitor circuit 104. The five signals shown in FIG. 6 are used to operate the integrators of the delta sigma modulator portion of delta sigma ADC 10, as subsequently explained with reference to FIGS. 5A–E. The logic circuit shown in FIG. 6 could also be implemented in various other ways.

Figure 5A:
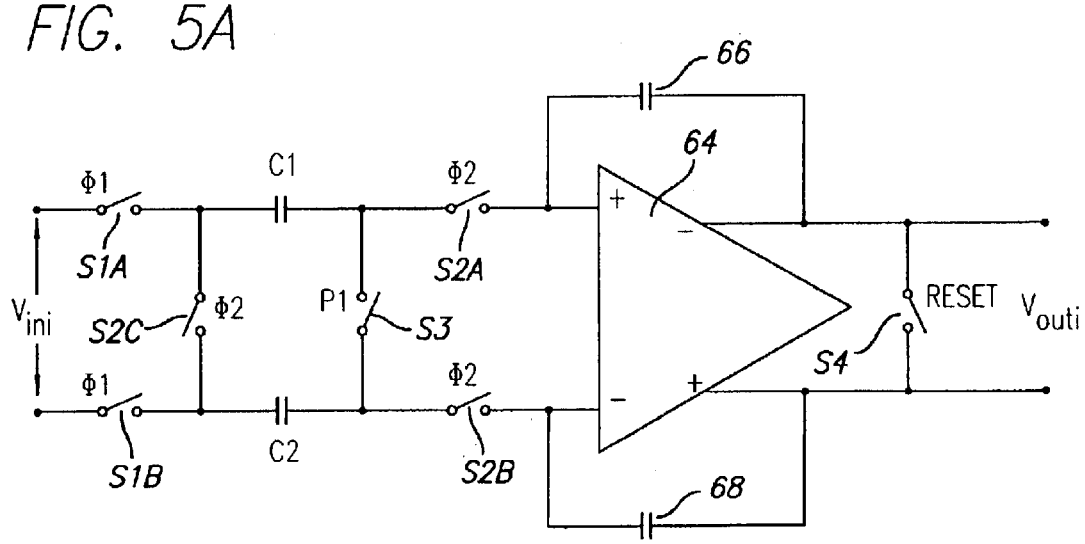
FIG. 5A is a schematic diagram of an integrator of the present invention as shown in FIG. 3.

A preferred implementation of each of the integrators 90-1,2 . . . n in delta sigma ADC 10 is shown in FIG. 5A. An analog input signal VINi produced by either analog summer 102 or a preceding integrator is applied between a first terminal of a first sampling switch S1A and a second input terminal connected to one terminal of a second sampling switch S1B. The second terminal of sampling switch S1A is connected to one terminal of a switch S2C and also to a first terminal of a first sampling capacitor C1. The second terminal of sampling switch S1B is connected to the other terminal of switch S2C and a first terminal of a second sampling capacitor C2. A second terminal of sampling capacitor C1 is connected to a first terminal of a switch S3 and also to one terminal of a first charge transfer switch S2A. A second terminal of sampling capacitor C2 is connected to the second terminal of switch S3 and to one terminal of a second charge transfer switch S2B. The second terminal of charge transfer switch S2A is connected to the (+) input of an operational amplifier 64 and to a first terminal of a first integrating capacitor 66. The second terminal of transfer switch S2B is connected to the (−) input of operational amplifier 64 and to one terminal of a second integrating capacitor 68. The second terminal of integrating capacitor 66 is connected to a (−) output of operational amplifier 64 and to one terminal of a reset switch S4, the other terminal of which is connected to a (+) output of operational amplifier 64 and to a second terminal of integrating capacitor 68. An integrator output voltage VOUTi is produced between the (−) and (+) outputs of amplifier 64. Sampling switches S1A and S1B are controlled by $\phi 1$, switches S2A, S2B and S2C are controlled by $\phi 2$, switch S3 is controlled by P1, and switch S4 is controlled by RESET.

Figure 5B:
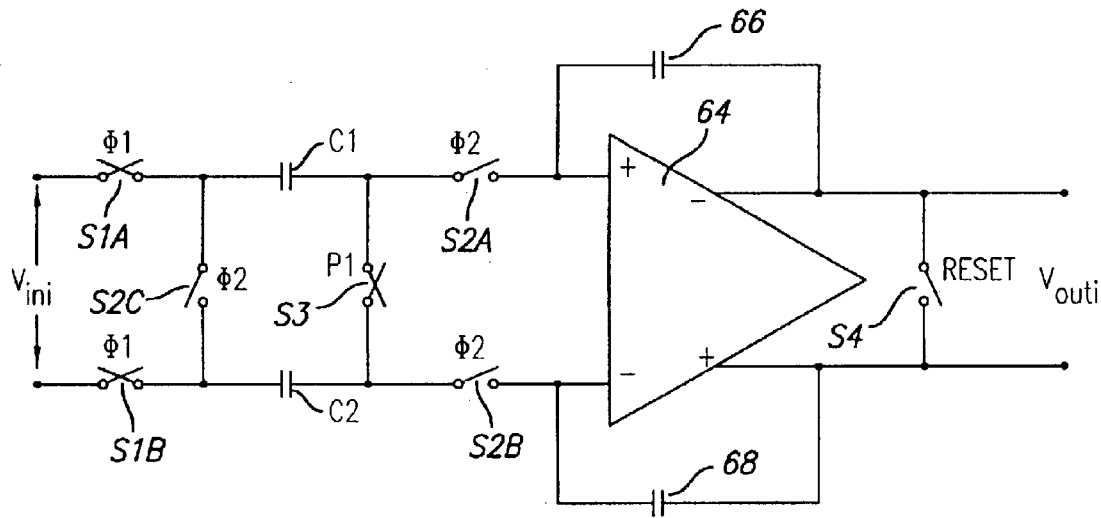
FIG. 5B is a schematic diagram showing the state of the integrator of FIG. 5A during $\phi 1$ of normal analog-to-digital conversion operation.
Figure 5C:
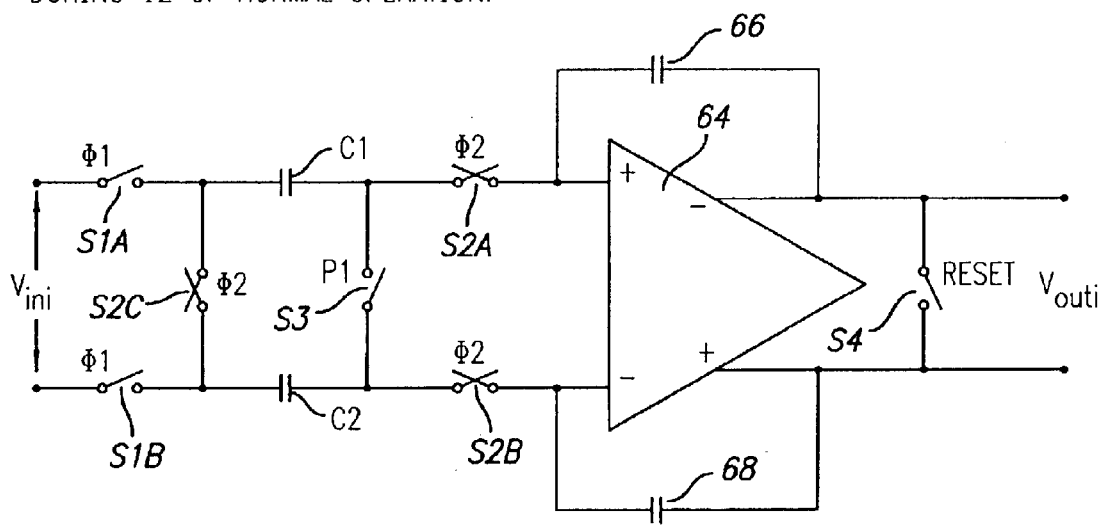
FIG. 5C is a schematic diagram showing the state of the integrator of FIG. 5A during $\phi 2$ of normal analog-to-digital conversion operation.
Figure 5D:
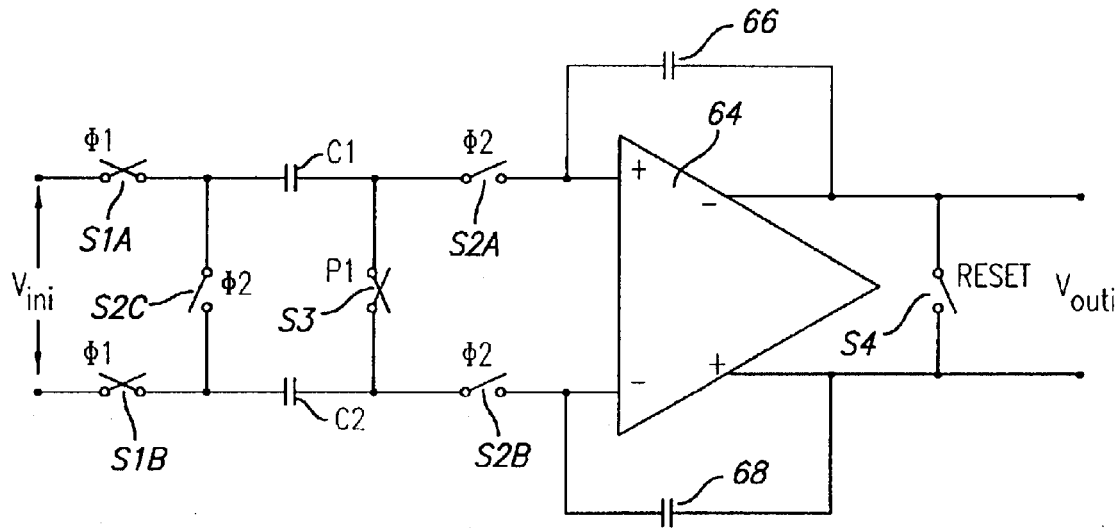
FIG. 5D is a schematic diagram showing the state of the integrator of FIG. 5A during $\phi 1$ of a restore operation.
Figure 5E:
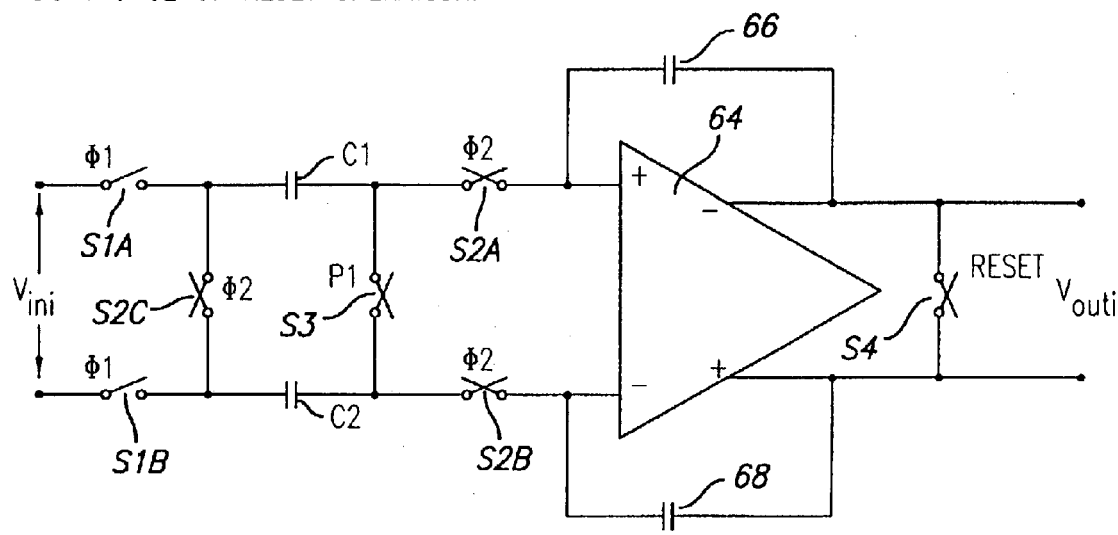
FIG. 5E is a schematic diagram showing the state of the integrator of FIG. 5A during $\phi 2$ of a restore operation.

FIG. 5B shows that during $\phi 1$ of "normal analog-to-digital conversion operations", sampling switches S1A and S1B and switch S3 are closed, switch S2C, and charge transfer switches S2A and S2B and reset switch S4 are open. FIG. 5C shows that during $\phi 2$ of normal analog-to-digital conversion operations, sampling switches S1A and S1B and switch S3 are open, charge transfer switches S2A and S2B and switch S2C are closed, and reset switch S4 is open. FIG. 5D shows that during the $\phi 1$ of "restore/reset operations", sampling switches S1A and S1B and switch S3 are closed, and switch S2C, charge transfer switches S2A and S2B, and reset switch S4 are open. FIG. 5E shows that during $\phi 2$ of restore/reset operations, sampling switches S1A and S1B are open, and switch S2C, switch S3, charge transfer switches S2A and S2B, and reset switch S4 are closed.

It should be understood that the output of a delta sigma modulator circuit operating within expected parameters typically has a particular expected maximum "run length" of "1"s or "0"s from, for example, 6 to 10 bits in a row. (The maximum run length depends on the particular design of the delta sigma modulator.) For run lengths sufficiently longer than 10 consecutive "1"s or "0"s in a row, it may be determined with relative certainty that the modulator circuit 84 has become "overloaded" and is oscillating, causing the serial modulator output signal to be inaccurate, in which case the delta sigma modulator needs to be restored to a stable condition.

Figure 8:
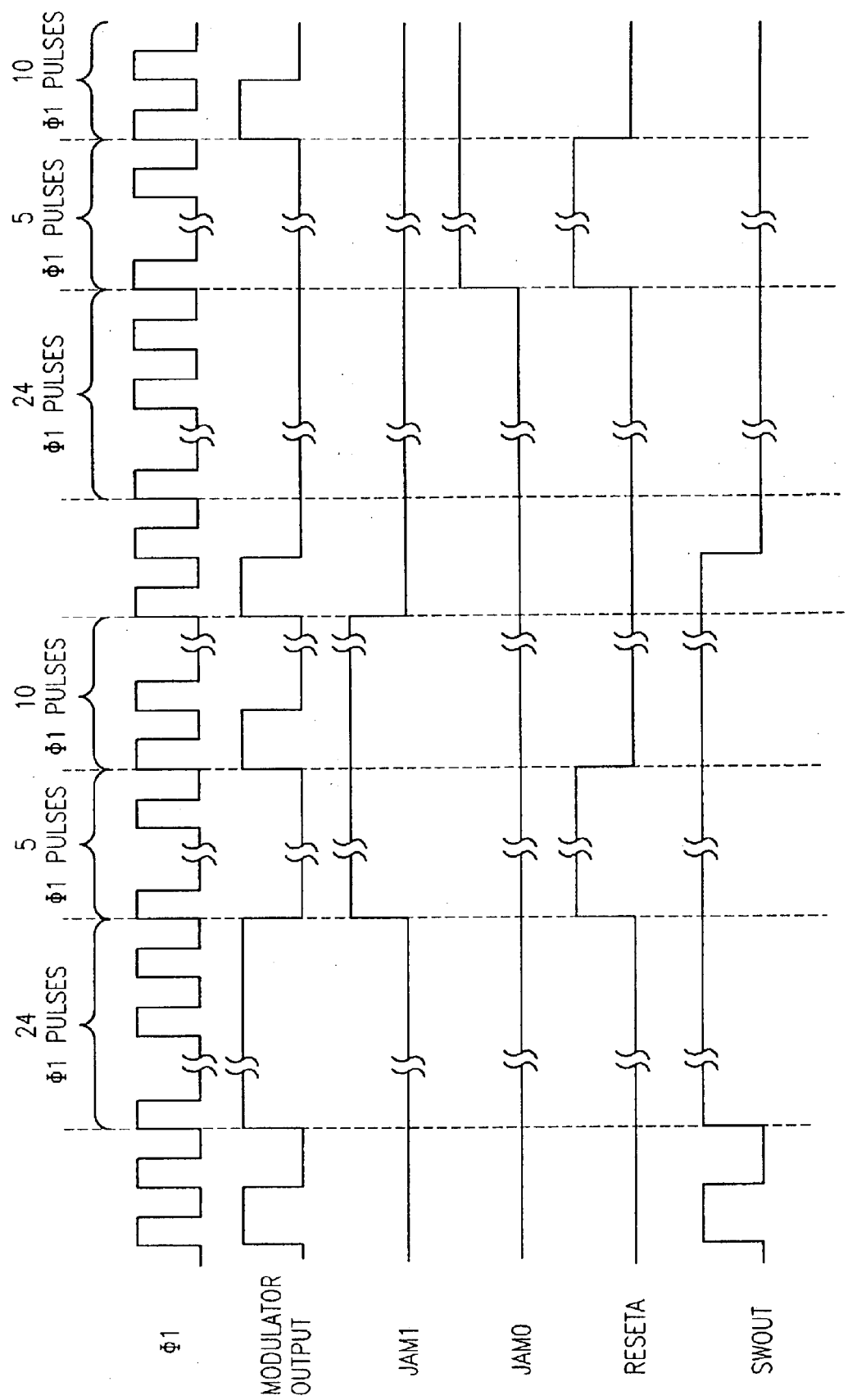
FIG. 8 is a timing diagram that shows additional waveforms useful in explaining the operation of the circuitry shown in FIGS. 3–6.

In the described embodiment, monitor circuit 104 of FIGS. 3 and 8 is configured to count the numbers of consecutive "1"s and "0"s and responsively generate the restore signal RESETA if the number of consecutive "1"s or "0"s ever reaches 24. The information included in the signal RESETA is used by reset and clock generator circuit 74 to generate the restore signal RESET that is sent to control the switch S4 in each of the integrator stages 90-1,2 . . . n. The signal P1 produced by reset and clock generator circuit 74 controls each switch S3 of the various integrators to restore the various integrator stages 90-1,2 . . . n to stable conditions. This results in normal operation of each of the integrators 90-1,2 . . . n wherein if RESETA is at a low or "0" level, then reset switch S4 remains open and switch S3 turns on and off as if controlled by $\phi$1, and also results in reset or restore operation of each integrator wherein if RESETA is at a high or "1" level then switch S3 remains on and reset switch S4 turns off and on as if controlled by $\phi$2. The number of consecutive "1"s or "0"s at which the restore signal RESETA is generated may, of course, be higher or lower than 24 depending on the requirements for a particular application and the order of the delta sigma modulator.

Figure 1:
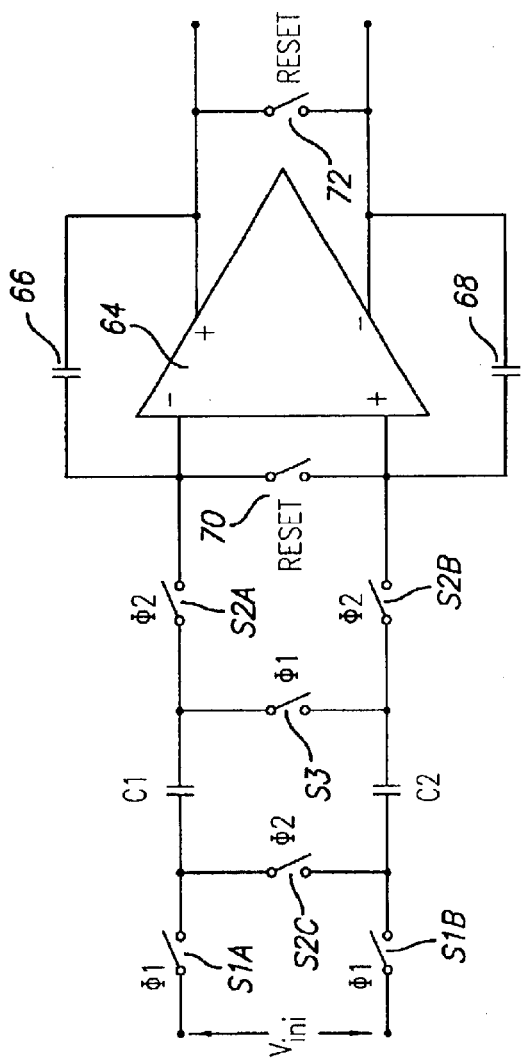
FIG. 1 is a schematic diagram of a prior art integrator used in the delta sigma modulator of FIG. 2.
Figure 2:
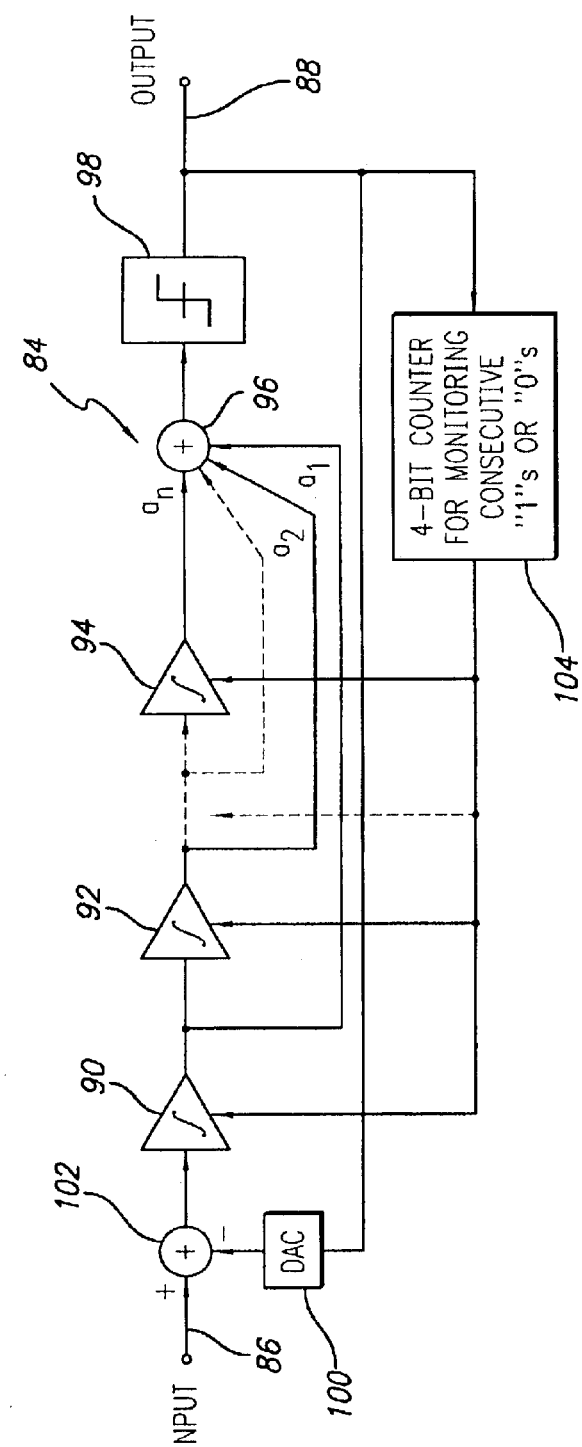
FIG. 2 is a block diagram of a prior art high order delta sigma modulator.

By comparing prior art FIG. 1 to FIG. 5A, it can be seen that reset switch 70 of prior art FIG. 1 does not exist in the present invention. Furthermore, switch S3 and reset switch S4 operate substantially differently in the integrator of the present invention than in the integrator of prior art FIG. 1. Elimination of switch 70 of prior art FIG. 1 from the integrator of FIG. 5A eliminates the undesirable effect of the above-mentioned parasitic capacitances, and also avoids any need to generate an additional reset signal that may be required to ensure that switch 70 and 72 are turned on at exactly the same times and turned off at exactly the same times. Since a precisely balanced condition of the (+) and (−) inputs of operational amplifier 64 is critical to obtaining high conversion accuracy in a higher order delta sigma modulator, the abovementioned differences from the circuit shown in prior art FIG. 1 herein are especially important to accurate redistribution of the charges on the sampling capacitors C1 and C2 onto the integrating capacitors 66 and 68, respectively, and hence to the overall accuracy of the ADC 10.

FIG. 7 shows a timing diagram of $\phi$1, $\phi$2, RESETA, and the P1 and RESET signals produced by clock and reset generator circuit 74 for a both normal analog-to-digital conversion operation and for reset operation. The timing diagram of FIG. 8 shows $\phi$1 and an example of the signal MODULATOR OUTPUT on conductor 88 and the resulting waveforms for the RESETA signal, the JAM1 signal produced in response to a positive overvoltage level of the input voltage VINi and the resulting SWOUT signal produced by SW1 and the JAM0 signal produced in response to a negative overvoltage input level of VINi and the resulting SWOUT signal produced by SW1.

More specifically, FIG. 8 shows a sample of the MODULATOR OUTPUT signal on conductor 88 and the JAM1 signal produced in response to instability caused by a positive overvoltage value of VINi so that the delta sigma modulator of ADC 10 produces "1"s for 24 consecutive clock periods of $\phi$1, and also shows the resulting SWOUT signal produced on conductor 89 by switch circuit SW1 so that it "jams" the input of digital decimation filter 106 with "1"s for at least 15 consecutive clock periods of $\phi$1. FIG. 8 also shows the JAM2 signal produced in response to a negative overvoltage value of VINi so that the delta sigma modulator of ADC 10 produces "0"s for 24 consecutive clock periods of $\phi$1, and also shows the resulting SWOUT signal produced on conductor 89 by switch circuit SW1 so that it jams the input of decimation filter 106 with "0"s for at least 15 consecutive clock periods of $\phi$1. FIG. 8 also shows that the RESETA output produced on conductor 78 by monitor circuit 104 begins whenever either 24 consecutive "1"s or 24 consecutive "0"s are detected in the MODULATOR OUTPUT signal on conductor 88, and further shows that each RESETA pulse lasts for 5 clock cycles.

Figure 9:
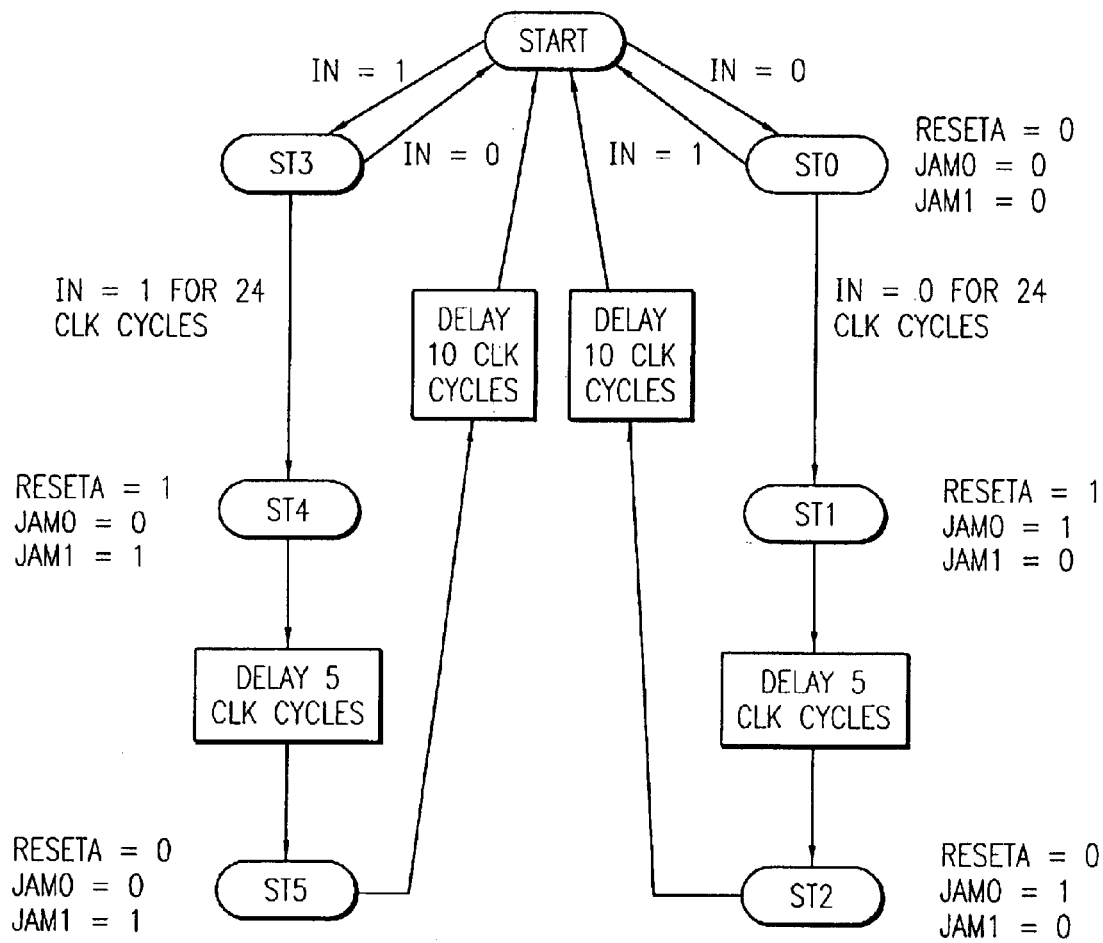
FIG. 9 is a state diagram of a state machine included in block 104 of FIG. 3.

Referring to FIG. 9, 5-bit monitor circuit 104 can be implemented as a state machine which, upon detecting consecutive "1"s or "0"s on conductor 88, increments from an initial state ST0 or ST3 sequentially toward a final counter state ST2 or ST5 after 24 consecutive "1"s or "0"s, respectively, have been counted. A delay of 5 clock (CLK) cycles, i.e., 5 $\phi$1,$\phi$2 cycles, is interposed between the states St1 and ST2, and similarly, a delay of 5 clock cycles is interposed between states ST4 and ST5 to ensure that the reset switches of the integrators are turned on long enough to completely reset the entire modulator.

Once the state machine reaches the final counter state ST2 or ST5, it advances to a restore state and remains in that restore state for a number of clock cycles, in this case, 10 clock cycles. This is an amount of time sufficient for the modulator to stabilize (i.e., to allow all of the integrator stages 90-1,2 . . . n to arrive at stable states) before the jamming signal JAM1 is released. Note that if the analog input on conductor 86 is at a (+) out-of-range value for a long period of time, then the monitor circuit will continue detecting the resulting "saturated" condition of the delta sigma modulator and will repeatedly reset or restore it by causing switches S3 and S4 to close. Each time this happens, a short amount of time will be required for the restored integrators to recover or re-attain the "saturated" condition in response to the continued (+) out-of-range value of the analog input signal. Prior to a time at which the modulator becomes unstable, the input of digital filter 106 has already been filled with either a string of "1"s or "0"s, so the duration of the jamming signal, e.g., JAM1, is not very critical. The critical point occurs when the modulator reset signal RESET is released, and the jamming signal should be provided for a long enough period of time to include the modulator recovery from the reset state. In the embodiment of FIG. 3, it was determined that 10 clock cycles is a sufficiently long duration to ensure that the (+) full-scale output of the digital filter is steadily maintained despite the repetitive resetting of the integrators that occurs during a steady, continuous (+) out-of-range input signal. The delay of 10 clock cycles shown in FIG. 9 after state ST5, and also after state ST2, is selected so as to provide the above mentioned sufficiently long duration. (The number of cycles for which the state machine remains in the restore state may be a fixed number, or may vary in relation to various factors, such as the severity of the instability and whether stability has been achieved.)

Since 5-bit monitor circuit 104 and switch circuit SW1 cooperate to the jam "1"s into the input of decimation filter 106 for a sufficiently long time interval to establish a clear full scale decimation filter output of all "1"s whenever the occurrence of an over-range value of INPUT is detected, the present invention avoids the previously described problem associated with the delta sigma modulator described in U.S. Pat. No. 6,362,763, wherein the digital filter is reset along with the modulator regardless of whether the detected instability is caused by a (+) or (−) out-of-range input signal, resulting in the failure to produce an appropriate (+) full scale digital output. Therefore, the delta sigma ADC 10 of the present invention is well-suited to measuring DC input voltage is and accurately indicating the occurrence of an out-of-range input signal.

It should be understood that a steady digital (+) full scale analog-to-digital converter output indicative of a (+) out-of-range analog input signal can be accomplished using only the single jamming signal JAM1, and relying on the resetting of the integrators by monitor circuit 104 to produce strings of sequential "0"s that are passed through switch circuit SW1 and therefore are, in effect, jammed into the input of digital filter 106. Therefore, it is not essential to the basic idea of the present invention that monitor circuit 104 perform the function of generating the above described JAM0 signal to cause switch circuit SW1 to jam "0"s into the input of digital filter 106 to produce a digital (−) full-scale value in response to a (−) out-of-range analog input signal.

However, it is advantageous to use both the JAM1 and JAM0 signals as described previously, because if only the JAM1 signal is used, the RESET signal and the JAM1 signal must be released at exactly at the same time, and the modulator may recover from the reset, i.e., restored, condition very rapidly, causing the possibility of a perturbation in the (−) full-scale output code that should be maintained at the digital filter output as a result of the application a steady (−) out-of-range analog input signal.

Figure 10:
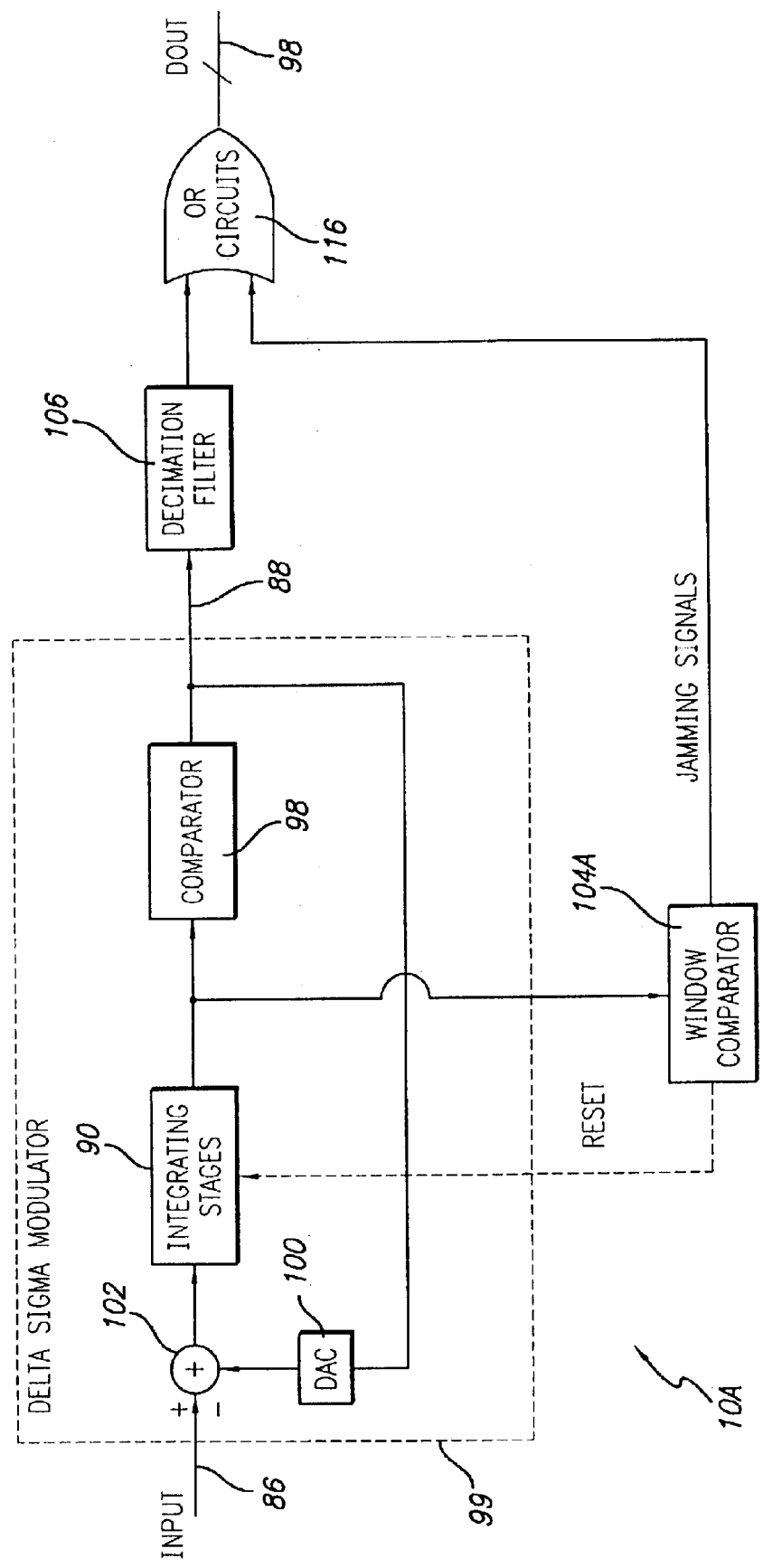
FIG. 10 is a block diagram of another implementation of the delta sigma ADC of present invention.

FIG. 10 shows a more generalized implementation of an ADC 10A of the present invention in which the condition of the delta sigma modulator 99 is monitored by a window comparator 104A to produce a reset signal if the output of the integrating section 90 indicates an unstable condition caused by a (+) out-of-range analog input signal and also produces a jamming signal that causes ADC 10A to generate a corresponding (+) fall scale digital output of the ADC. The input of a window comparator 104A is connected to the output of integrator section 90. During circuit design, the range of voltage at (for example) the output of integrating section 90 that is required for stable delta sigma modulator operation can be determined and used to provide the reference voltages, i.e., threshold voltages, needed for window comparator 104A. Thus, the quantizer input, instead of its output, can be monitored to detect an unstable condition and used to generate the modulator reset signal and the "jamming"signal needed in the present invention The output of window comparator circuit 104A can be used to jam the input of digital filter 106 to cause it to directly produce the (+) full scale digital output of ADC in response to the (+) out-of-range input signal, or alternatively, the output of window comparator circuit 104A can be utilized to produce a signal that is logically ORed by logic circuit 116 with the output of the digital filter so as to produce the (+) full scale digital output of ADC on output bus 98 in response to the (+) out-of-range input signal.

In addition to the previously mentioned advantages, the above described integrator circuitry of the present invention also avoids the inaccuracies due to the previously described unbalanced parasitic capacitances associated with the integrator circuit of U.S. Pat. No. 6,362,763, and further avoids the additional hardware complexity of providing the switch 70 and generating and routing and additional reset signal to control switch 70 that would be required by the integrator circuit of U.S. Pat. No. 6,362,763.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, the operating characteristics of the modulator may be monitored at various other points within the modulator circuit such as at the input, at the output, or at the input or output of any integrator stage. In some cases, it may be practical to reset fewer than all of the integrators of the delta sigma modulator in response to the reset signal RESETA produced by monitor circuit 104.

It should be understood that in some delta sigma modulators, it may not be necessary to use a monitor circuit such as 104 to reset one or more of the integrators if an instability occurs, if so-called "leaky" integrators are used, because leaky integrators automatically reset themselves. In this case, although the monitor circuit does not need to be used to reset the integrators, it does need to produce the jarring signals that result in a digital (+) full scale output signal being produced in response to a (+) out-of-range analog input signal.

Various known delta sigma modulator configurations other than the feed-forward configuration shown in FIG. 3 could be used with the present invention. For example, some other configurations do not have a second summer or any of the feed forward conductors. Other known configurations include additional summing nodes at the outputs of the integrators and also include additional DACs. For example, FIG. 8 of above mentioned U.S. Pat. No. 6,362,763 shows yet another delta sigma modulator configuration that could be used in conjunction with the present invention.

What is claimed is:

1. An analog-to-digital converter comprising:
    (a) a delta sigma modulator including
        i. an input conductor, and a first summing device having a first input coupled to the input conductor,
        ii. a quantizer for producing a modulator output signal on an output of the quantizer,
        iii. a plurality of integrators coupled sequentially between an output of the first summing device and an input of the quantizer, and
        iv. a digital-to-analog converter having an output coupled to a second input of the first summing device for providing feedback representative of signal conditions in one or more of the integrators;
    (b) a monitor circuit including an input responsive to one of a signal appearing at the quantizer input and a signal appearing at the quantizer output to produce a first control signal in response to occurrence of an instability condition caused by a out-of-range input signal on the input conductor and represented by the one of the signals at the quantizer input and quantizer output, respectively;

(c) a logic circuit including a data input coupled to receive the modulator output signal, a data output for conducting a logic circuit output signal, and a first control input coupled to receive the first control signal; and (d) a digital filter including an input coupled to the data output of the logic circuit and an output coupled to an output bus of the analog-to-digital converter.

2. The analog-to-digital converter of claim 1 wherein the monitor circuit includes an input coupled to the output of the delta sigma modulator, and a restore output for producing a restore signal coupled to a reset input of at least one of the integrators to reset the delta sigma modulator from an unstable condition to a stable condition, the monitor circuit producing a first jamming signal in response to occurrence of a first signal condition of the modulator output signal caused by the out-of-range input signal on the input conductor.

3. The analog-to-digital converter of claim 2 wherein the plurality or integrators are coupled sequentially between an output of the first summing device and a second summing device, an output of each integrator being fed forward to an input of the second summing device, respectively, each integrator having a reset input the quantizer having an input coupled to an output of the second summing device for producing a modulator output signal on the quantizer output, and wherein the monitor circuit includes an input coupled to the quantizer output, the monitor circuit also producing a second jamming signal in response to occurrence of a second signal condition of the modulator output signal caused by the out-of-range input signal on the input conductor, and the logic circuit includes a data input coupled to receive the modulator output signal, a data output for conducting the logic circuit output signal, and first and second control inputs coupled to receive the first and second jamming signals, respectively.

4. The analog-to-digital converter of claim 3 wherein the logic circuit is configured to produce a first sequence of logical "1"s in response to the first jamming signal and to produce a second sequence of logical "0"s in response to the second jamming signal.

5. The analog-to-digital converter of claim 3 wherein one or more of the integrators each includes:

first and second input terminals and first and second output terminals, first and second sampling switches, a first switch, first and second sampling capacitors, a second switch, first and second charge transfer switches, an operational amplifier, first and second integrating capacitors, and a reset switch, a first terminal of the first sampling switch being coupled to the first input terminal and a first terminal of the second sampling switch being coupled to the second input terminal, a second terminal of the first input sampling switch being coupled to a first terminal of the first switch and a first terminal of the first sampling capacitor, a second terminal of the second input sampling switch being coupled to a second terminal of the first switch and a first terminal of the second sampling capacitor, a second terminal of the first sampling capacitor being coupled to a first terminal of the second switch and a first terminal of the first charge transfer switch, a second terminal of the second sampling capacitor being coupled to a second terminal of the second switch and a first terminal of the second charge transfer switch, a second terminal of the first charge transfer switch being coupled to a input of the operational amplifier and a first terminal of the first integrating capacitor, a second terminal of the second charge transfer switch being coupled to a input of the operational amplifier and a first terminal of the second integrating capacitor, a second terminal of the first integrating capacitor being coupled to a output of the operational amplifier and a first terminal of the reset switch, a second terminal of the second integrating capacitor being coupled to a output of the operational amplifier and a second terminal of the reset switch.

6. The analog-to-digital converter of claim 5 wherein the first and second sampling switches are controlled by a first clock signal, the first switch and the first and second charge transfer switches are controlled by a second clock signal, the second switch is controlled by a derived clock signal that is derived from the first and second clock signals and the restore signal, and the reset switch is controlled by a reset signal that is derived from the first and second dock signals and the restore signal.

7. The analog-to-digital converter of claim 6 wherein the derived clock signal and the reset signal are derived by means of a circuit that performs a logical ORing function on the first dock signal and the restore signal to generate the derived clock signal and also performs a logical ANDing function on the second dock signal and the restore signal to produce the reset signal.

8. The analog-to-digital converter of claim 1 wherein the monitor circuit includes a window comparator having an input coupled to the input of the quantizer.

9. An analog-to-digital converter comprising:

(a) a delta sigma modulator including
 i. an input conductor, and a first summing device having a first input coupled to the input conductor;
 ii. a quantizer for producing a modulator output signal on an output of the quantizer;
 iii. a plurality of integrators coupled sequentially between an output of the first summing device and an input of the quantizer, and
 iv. a digital-to-analog converter having an output coupled to a second input of the first summing device for providing feedback representative of signal conditions in one or more of the integrators:

(b) a monitor circuit including an input responsive to one of a signal appearing at the quantizer input and a signal appearing at the quantizer output to produce a first control signal in response to occurrence of an instability condition caused by a out-of-range input signal on the input conductor and represented by the one of the signals at the quantizer input and quantizer output, respectively;

(c) a logic circuit including a data input coupled to receive the modulator output signal, a data output for conducting a logic circuit output signal, and a first control input coupled to receive the first control signal; and (d) a digital filter including an input coupled to the data output of the logic circuit and an output coupled to an output bus of the analog-to-digital converter, wherein the monitor circuit includes an input coupled to the output of the delta sigma modulator, and a restore output for producing a restore signal coupled to a reset input of at least one of the integrators to reset the delta sigma modulator from an unstable condition to a stable condition, the monitor circuit producing a first jamming signal in response to occurrence of a first signal condition of the modulator output signal caused by the out-of-range input signal on the input conductor, wherein the plurality of integrators are coupled sequentially between an output of the first summing device and a second summing device, an output of each integrator being fed forward to an input of the second summing device, respectively, each integrator having a reset input, the quantizer having an input coupled to an output of the second summing device for producing a modulator output signal on the quantizer output, and wherein the monitor circuit includes an input couple to the quantizer output, the monitor circuit also producing a second jamming signal in response to occurrence of a second signal condition of the modulator output signal caused by a out-of-rage input signal on the input conductor, and the logic circuit includes a data input coupled to receive the modulator output signal, a data output for conducting the logic circuit output signal, and first and second control inputs coupled to receive the first and second jamming signals, respectively, wherein the logic circuit is configured to produce a first sequence of logical "1"s in response to the first jamming signal and to produce a second sequence of logical "0"s in response to the second jamming signal, and wherein the first jamming signal has a duration equal to a duration of a predetermined number of clock pulses, and the logic circuit produces a predetermined number of "1"s in response to the predetermined number of clock pulses.

10. The analog-to-digital converter of claim 9 wherein the second jamming signal has a duration equal to the duration of the predetermined number of clock pulses, and the logic circuit produces the predetermined number of "0"s in response to the predetermined number of clock pulses.

11. An analog-to-digital converter comprising:
(a) a delta sigma modulator including
  i. an input conductor, and a first summing device having a first input coupled to the input conductor,
  ii. a quantizer for producing a modulator output signal on an output of the quantizer,
  iii. a plurality of integrators coupled sequentially between an output of the first summing device and an input of the quantizer, and
  iv. a digital-to-analog converter having an output coupled to a second input of the first summing device for providing feedback to the second input representative of signal conditions in one or more of the integrators;
(b) a monitor circuit including an input responsive to one of a signal appearing at the quantizer input and a signal appearing at the quantizer output to produce a first control signal in response to occurrence of an instability condition caused by a out-of-range input signal on the input conductor and represented by the one of the signals at the quantizer input and quantizer output, respectively;
(c) a logic circuit including a data input coupled to receive the modulator output signal, a data output for conducting a logic circuit output signal, and a first control input coupled to receive the first control signal; and
(d) a digital filter including an input coupled to the data output of the logic circuit and an output coupled to an output bus of the analog-to-digital converter, wherein the monitor circuit includes an input coupled to the output of the delta sigma modulator, and a restore output for producing a restore signal coupled to a reset input of at least one of the integrators to reset the delta sigma modulator from an unstable condition to a stable condition, the monitor circuit producing a first jamming signal in response to occurrence of a first signal condition of the modulator output signal caused by the out-of-range input signal on the input conductor, wherein the plurality of integrators are coupled sequentially between an output of the first summing device and a second summing device, an output of each integrator being fed forward to an input of the second summing device, respectively, each integrator having a reset input, the quantizer having an input coupled to an output of the second summing device for producing a modulator output signal on the quantizer output, and wherein the monitor circuit includes an input coupled to the quantizer output, the monitor circuit also producing a second jamming signal in response to occurrence of a second signal condition of the modulator output signal caused by a out-of-range input signal on the input conductor, and the logic circuit includes a data input coupled to receive the modulator output signal, a data output for conducting the logic circuit output signal, and first and second control inputs coupled to receive the first and second jamming signals, respectively, and wherein the monitor circuit includes a state machine that performs the functions of monitoring the a number of consecutive "1"s and producing the first jamming signal and the restore signal if the number of consecutive "1"s exceeds a predetermined number, and wherein the state machine also performs the functions of monitoring the number of consecutive "0"s and producing the second jamming signal and the restore signal if the number of consecutive "0"s exceeds the predetermined number.

12. The analog-to-digital converter of claim 11 wherein the state machine produces the reset signal with a duration sufficient to allow sufficient time for the integrators to settle.

13. An analog-to-digital converter comprising:
(a) a delta sigma modulator including
  i. an input conductor, and a first summing device having a first input coupled to the input conductor,
  ii. a quantizer for producing a modulator output signal on an output of the quantizer,
  iii. a plurality of integrators coupled sequentially between an output of the first summing device and an input of the quantizer, and
  iv. a digital-to-analog converter having an output coupled to a second input of the first summing device for providing feedback to the second input representative of signal conditions in one or more of the integrators;
(b) a monitor circuit including an input responsive to one of a signal appearing at the quantizer input and a signal appearing at the quantizer output to produce a first control signal in response to occurrence of an instability condition caused by a out-of-range input signal on the input conductor and represented by the one of the signals at the quantizer input and quantizer output, respectively;
(c) a logic circuit including a data input coupled to receive the modulator output signal, a data output for conducting a logic circuit output signal, and a first control input coupled to receive the first control signal; and
(d) a digital filter including an input coupled to the data output of the logic circuit and an output coupled to an output bus of the analog-to-digital converter, wherein the monitor circuit includes an input coupled to the output of the delta sigma modulator, and a restore output for producing a restore signal coupled to a reset input of at least one of the integrators to reset the delta sigma modulator from an unstable condition to a stable condition, the monitor circuit producing a first jamming signal in response to occurrence of a first signal condition of the modulator output signal caused by the out-of-range input signal on the input conductor, wherein the plurality of integrators are coupled sequentially between an output of the first summing device and a second summing device, an output of each integrator being fed forward to an input of the second summing device, respectively, each integrator having a reset input, the quantizer having an input coupled to an output of the second summing device for producing a modulator output signal on the quantizer output, and wherein the monitor circuit includes an input coupled to the quantizer output, the monitor circuit also producing a second jamming signal in response to occurrence of a second signal condition of the modulator output signal caused by the out-of-range input signal on the input conductor, and the logic circuit includes a data input coupled to receive the modulator output signal, a data output for conducting the logic circuit output signal, and first and second control inputs coupled to receive the first and second jamming signals, respectively, and where in the logic circuit includes a first logic circuit for performing a logical ANDing function on the modulator output signal and the second jamming signal, and a second logic circuit for performing a logical ORing function on the first jamming signal and an output of the first logic circuit in order to produce the switch output signal.

14. An comprising:
(a) a delta sigma modulator including
 i. an input conductor, and a summing device having a first input coupled to the input conductor,
 ii. a quantizer for producing a modulator output signal on an output of the quantizer,
 iii. a plurality of integrators coupled sequentially between an output of the summing device and an input of the quantizer, and
 iv. a digital-to-analog converter having an output coupled to a second input of the summing device for providing feedback to the second input representative of signal conditions in one or more of the integrators;
(b) a monitor circuit including an input responsive to one of a signal appearing at the quantizer input and a signal appearing at the quantizer output to produce a control signal in response to occurrence of an instability condition caused by a positive input overvoltage on the input conductor and represented by the one of the signals at the quantizer input and output, respectively;
(c) a digital filter including an input coupled to the quantizer output and also including in output; and
(d) a logic circuit for performing a logical ORing function on the output of the digital filter and the control signal to produce either a digital full scale output indicative of a out-of-range analog input signal or a digital output signal produced by the digital filter,
wherein the monitor circuit includes a window comparator having an input coupled to the quantizer input.

15. A method of operating an analog-to-digital converter to provide a full-scale output signal in response to an instability caused by a out-of-range input signal, the delta sigma modulator including
 i. an input conductor for receiving the input signal, and a first summing device having a first input coupled to the input conductor,
 ii. a second summing device having a plurality of inputs and also having an output coupled to an input of a quantizer having an output coupled to an output of the delta sigma modulator,
 iii. a plurality of integrators coupled sequentially between an output of the first summing element and the second summing device, an output of each integrator being fed forward to an input of the second summing device, respectively, and
 iv. a digital-to-analog converter having an input coupled to the quantizer output and an output coupled to a second input of the first summing device, the method including;

(a) operating a monitor circuit in response to a signal on the quantizer output to produce a restore signal in response to a first signal condition on the quantizer output representing an unstable condition of at laest one of the integrators caused by the out-of-range input signal;

(b) operating the monitor circuit in response to the signal on the quantizer output to produce a first jamming signal;

(c) resetting the delta sigma modulator from the unstable condition to a stable condition in response to the restore signal;

(d) producing a first signal that includes the signal on the quantizer output if no jamming signal is present and includes a predetermined number of consecutive "1"s in response to the first jamming signal if there is a out-of-range input signal; and (e) coupling the first signal to an input of a digital filter to produce a second signal that represents an in-range input signal applied to the input conductor or that consists of a full-scale digital output signal if a out-of-range input signal is applied to the input conductor, wherein step (b) includes operating the monitor circuit in response to a second signal condition on the quantizer output to produce a second jamming signal, the second signal condition of the quantizer output being caused by a out-of-range input signal, step (d) includes producing a predetermined number of consecutive "0"s in the first signal in response to the second jamming signal if there is a out-of-range input signal, and step (e) includes producing the second signal to represent a full-scale digital output signal if a out-of-range input signal is applied to the input conductor.

16. An analog-to-digital converter circuit configured to provide a full-scale output signal in response to an instability caused by a out-of-range input signal, comprising:
(a) a delta sigma modulator circuit including
 i. circuitry for summing an input signal with a feedback signal representing signal conditions in a group of integrators to provide an input to a quantizer,
 ii. circuitry for monitoring a signal at the quantizer output to produce a restore signal indicate an instability condition, and
 iii. an integrator including a dual purpose switch that is operated together with first and second sampling switches to accomplish an input signal sampling operation and also is operated together with first and second charge transfer switches and an output reset switch to accomplish precise resetting of the integrator without being directly connected to the amplifier inputs;

(b) a monitor circuit including an input responsive to one of a signal appearing at the quantizer input and a signal appearing at the quantizer output to produce a control signal in response to occurrence of an instability condition caused by a positive input overvoltage on the input conductor and represented by the one of the signals at the quantizer input and output, respectively;

(c) a digital filter including an input coupled to the quantizer output and also including an output; and (d) a logic circuit coupled to the digital filter and the monitor circuit so as to produce either a digital full scale output indicative of a out-of-range analog input signal if the control signal is present or a digital analog-to-digital converter output signal produced by the digital filter if the control signal is not present logic circuitry for operating the dual purpose switch by performing a logical ORing of a first and clock signal and the restore signal and for operating the reset switch by performing a logical ANDing of a non-overlapping second clock signal and the restore signal.

* * * * *